United States Patent
Yamamoto et al.

(10) Patent No.: US 9,406,376 B2
(45) Date of Patent: Aug. 2, 2016

(54) MOTION VECTOR DETECTION APPARATUS AND METHOD

(75) Inventors: Takuma Yamamoto, Fuchu (JP); Nao Mishima, Inagi (JP); Yasutoyo Takeyama, Kawasaki (JP); Toshimitsu Kaneko, Kawasaki (JP); Toshiyuki Ono, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 931 days.

(21) Appl. No.: 13/405,522

(22) Filed: Feb. 27, 2012

(65) Prior Publication Data
US 2012/0213285 A1 Aug. 23, 2012

Related U.S. Application Data

(63) Continuation of application No. PCT/JP2009/071174, filed on Dec. 18, 2009.

(51) Int. Cl.
| H04N 7/12 | (2006.01) |
| G11C 11/56 | (2006.01) |
| G06T 7/20 | (2006.01) |
| H04N 19/56 | (2014.01) |
| H04N 19/53 | (2014.01) |

(52) U.S. Cl.
CPC .......... *G11C 11/5642* (2013.01); *G06T 7/2013* (2013.01); *H04N 19/53* (2014.11); *H04N 19/56* (2014.11); *G06T 2207/10016* (2013.01); *G06T 2207/20016* (2013.01); *G06T 2207/20021* (2013.01); *G11C 2211/5634* (2013.01)

(58) Field of Classification Search
None
See application file for complete search history.

(56) References Cited

U.S. PATENT DOCUMENTS

| 2004/0184542 A1* | 9/2004 | Fujimoto | H04N 19/59 375/240.16 |
| 2008/0212719 A1* | 9/2008 | Okada | H04N 19/57 375/340 |

FOREIGN PATENT DOCUMENTS

| JP | 3147893 | 1/2001 |
| JP | 2004-241880 | 8/2004 |
| JP | 2009-295029 | 12/2009 |

OTHER PUBLICATIONS

International Search Report mailed Feb. 2, 2010 in PCT/JP2009/071174 filed Dec. 18, 2009 (with English Translation).
International Written Opinion mailed Feb. 2, 2010 in PCT/JP2009/071174 filed Dec. 18, 2009.
English Translation of the International Preliminary Report on Patentability issued Jul. 19, 2012 in PCT/JP2009/071174.
English Translation of the Written Opinion issued Feb. 2, 2010 in PCT/JP2009/071174.

* cited by examiner

*Primary Examiner* — Sath V Perungavoor
*Assistant Examiner* — Dakshesh Parikh
(74) *Attorney, Agent, or Firm* — Oblon, McClelland, Maier & Neustadt, L.L.P

(57) ABSTRACT

According to one embodiment, a motion vector detection apparatus includes following units. The layering unit generates layers with different resolutions for each of first and second images. The first extraction unit extracts a space candidate vector. The second extraction unit extracts a time candidate vector. The third extraction unit extracts a layer candidate vector. The determination unit determines a motion vector to be assigned to the target block, based on correlations between the target block and blocks, the blocks being located in a layer which corresponds to the second image and being specified by assigning, to the target block, the space, time, and layer candidate vectors.

12 Claims, 10 Drawing Sheets

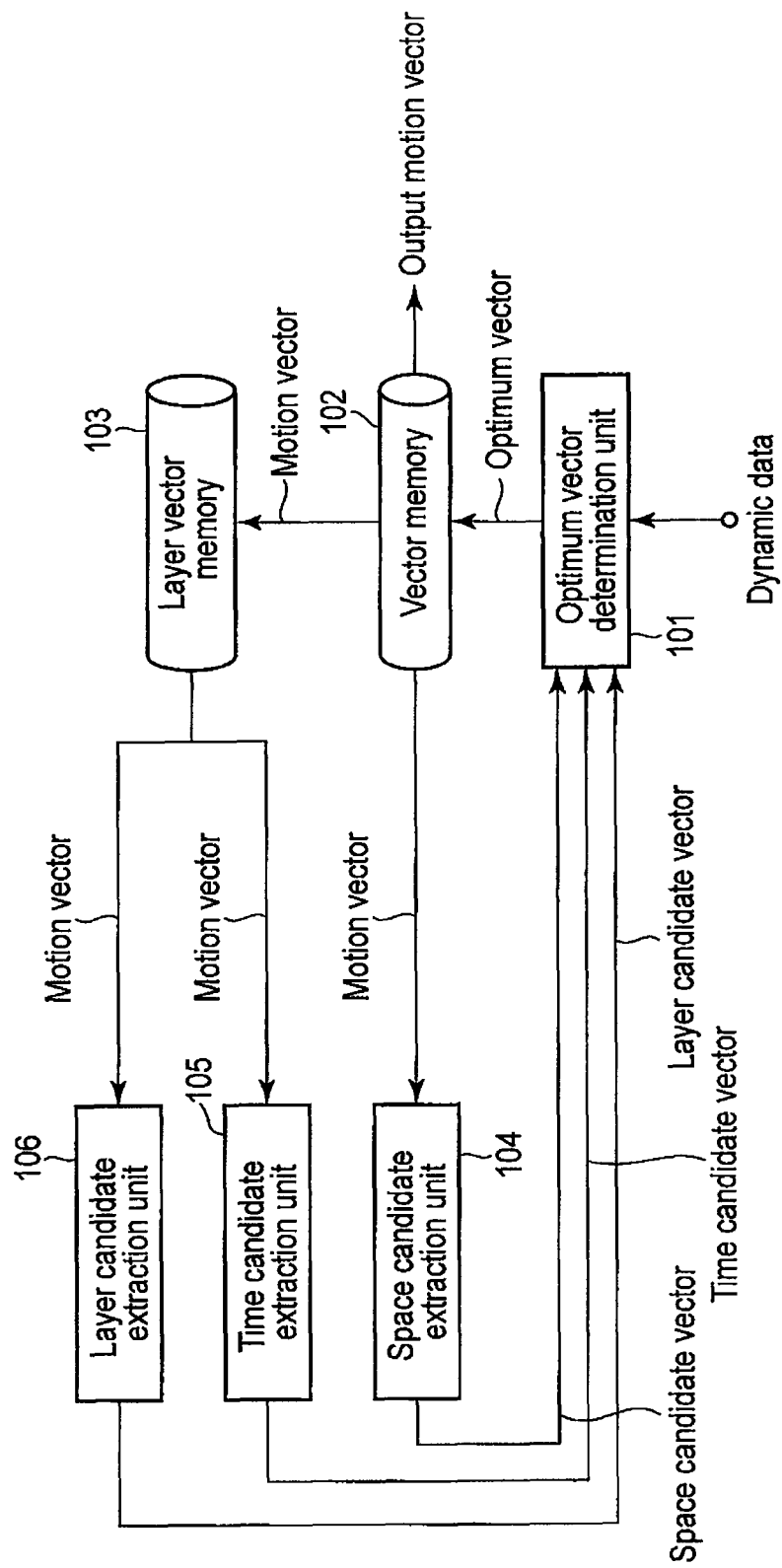
F I G. 1

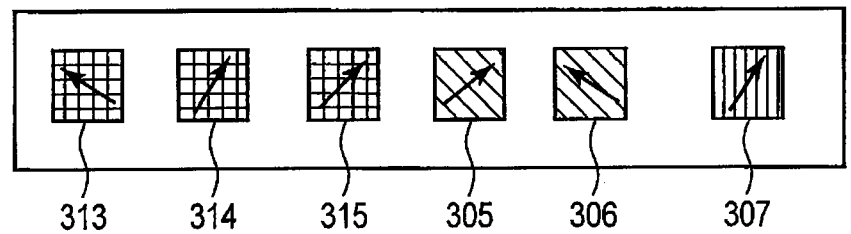
F I G. 5
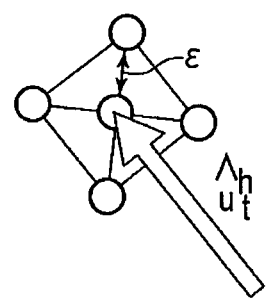
F I G. 6

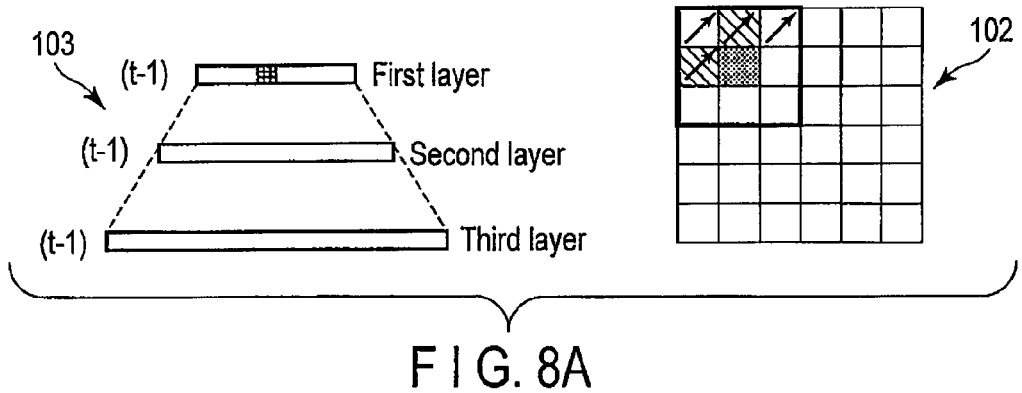
F I G. 8A
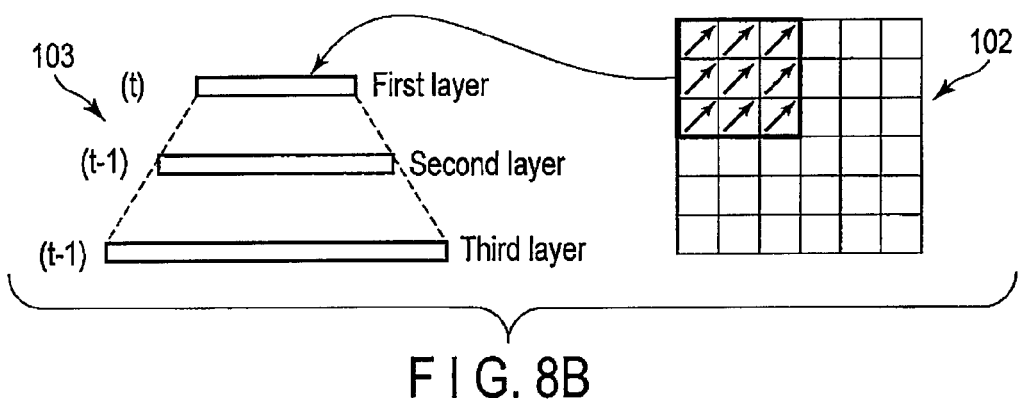
F I G. 8B
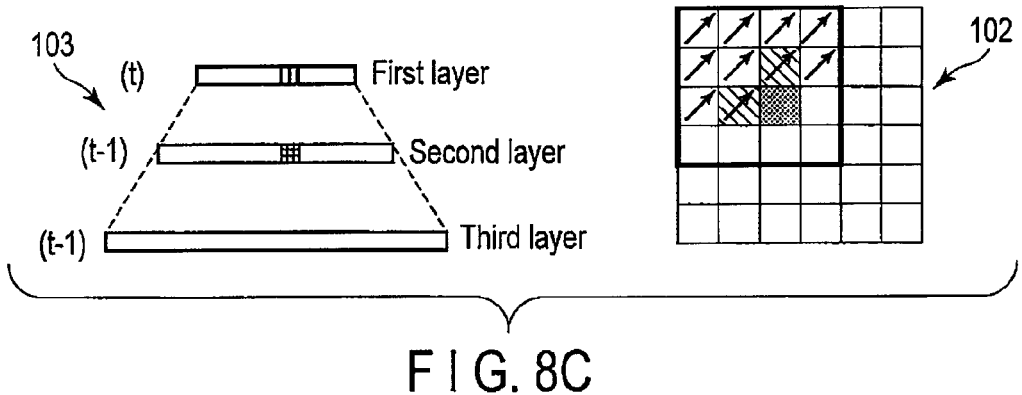
F I G. 8C

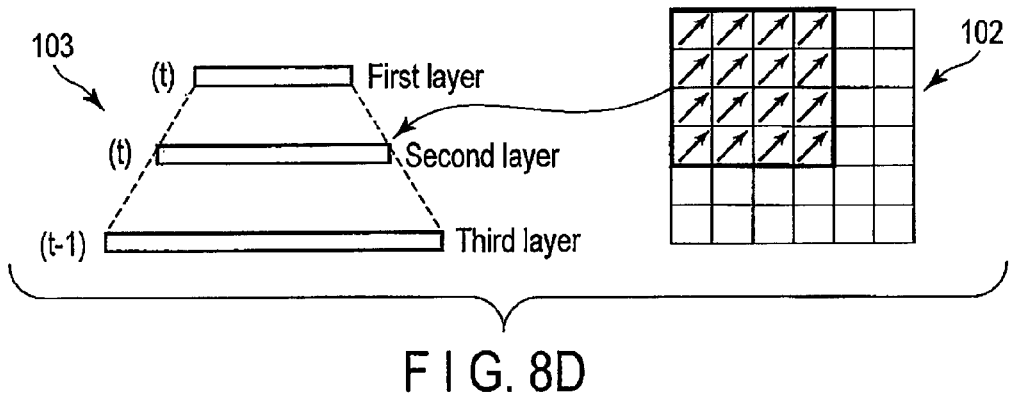
F I G. 8D
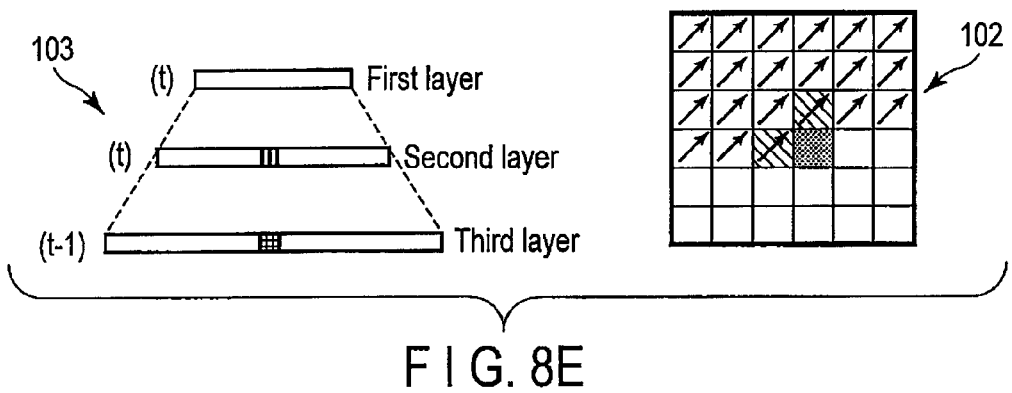
F I G. 8E
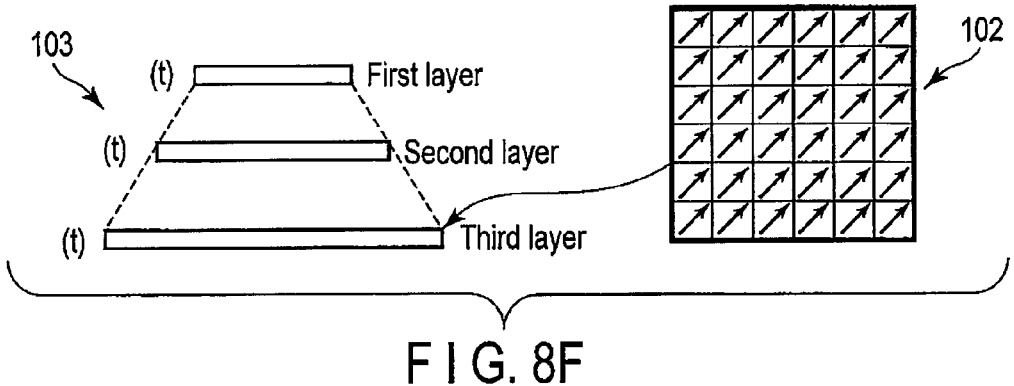
F I G. 8F

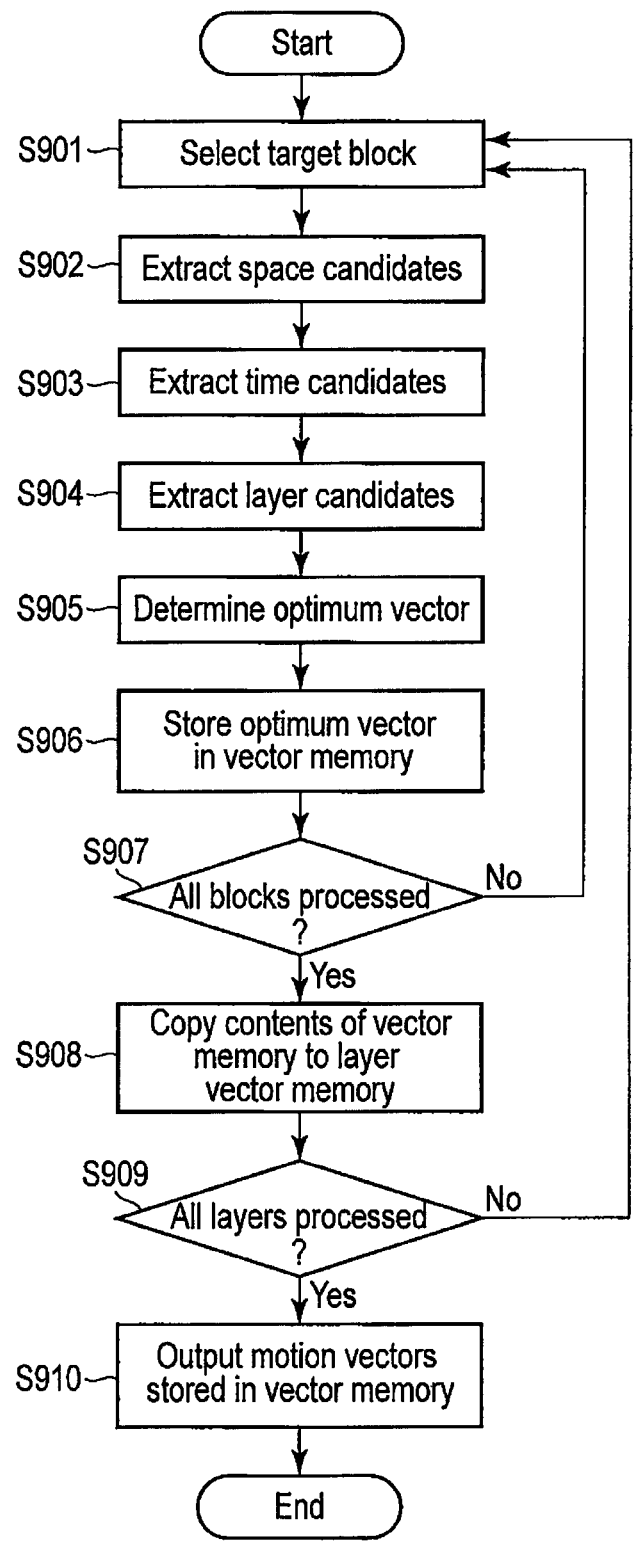
F I G. 9

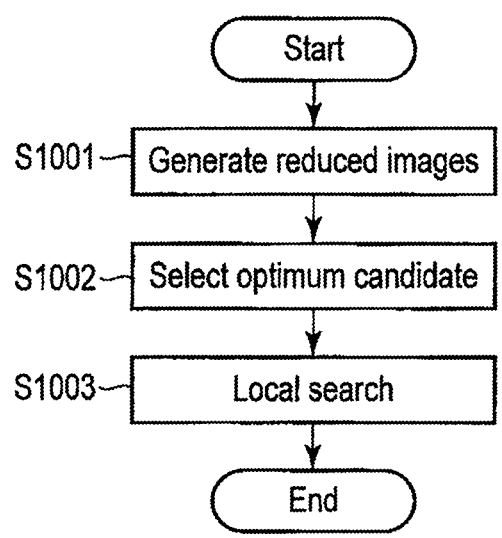
F I G. 10

MOTION VECTOR DETECTION APPARATUS AND METHOD

CROSS REFERENCE TO RELATED APPLICATIONS

This application is a Continuation application of PCT Application No. PCT/JP2009/071174, filed Dec. 18, 2009, the entire contents of which are incorporated herein by reference.

FIELD

Embodiments described herein relate generally to a motion vector detection apparatus and method for detecting, in moving image data, motion vectors for use in image processing such as moving image encoding.

BACKGROUND

In the conventional art, basic processing for moving image processing includes a motion search in which motion vectors indicative of the shift amounts of an object and the directions of the shift between frames of different times are detected. The motion search is utilized, for example, for a frame interpolation in which a new frame is interpolated between frames of a moving image to increase a frame rate, moving image encoding, image stabilization for a camera, and the like.

Japanese Patent No. 3147893 discloses a method of dividing each frame contained in moving image data into a plurality of blocks and detecting a motion vector for each block. However, if a flat area which is larger than a block size and involves almost no change in luminance is present in the frame, the accuracy with which motion vectors are detected disadvantageously decreases.

Furthermore, a method disclosed in JP-A 2004-241880 (KOKAI) layers each frame and detects motion vectors using, in addition to candidate vectors described in Japanese Patent No. 3147893, motion vectors already detected in a layer higher than that on which the detection of motion vectors is to be carried out. However, if a misdetection occurs in the higher layer, the motion vectors in the lower layer determined using the motion vectors in the higher layer as candidate vectors may disadvantageously be misdetected.

BRIEF DESCRIPTION OF THE DRAWINGS

FIG. 1 is a block diagram showing an example of a configuration of a motion vector detection apparatus according to an embodiment;

FIG. 5 is a schematic diagram showing reference blocks selected by a space candidate extraction unit, a time candidate extraction unit, and a layer candidate extraction unit;

FIG. 6 is a diagram illustrating a method by which a search unit determines an optimum vector based on an optimum candidate vector;

FIGS. 8A, 8B, 8C, 8D, 8E, and 8F are diagrams illustrating an operation of the vector memory and the layer vector memory;

FIG. 9 is a flowchart showing an example of a procedure for detecting motion vectors; and FIG. 10 is a diagram showing an example of a procedure in which an optimum vector determination unit determines the optimum vector.

DETAILED DESCRIPTION

Figure 2:
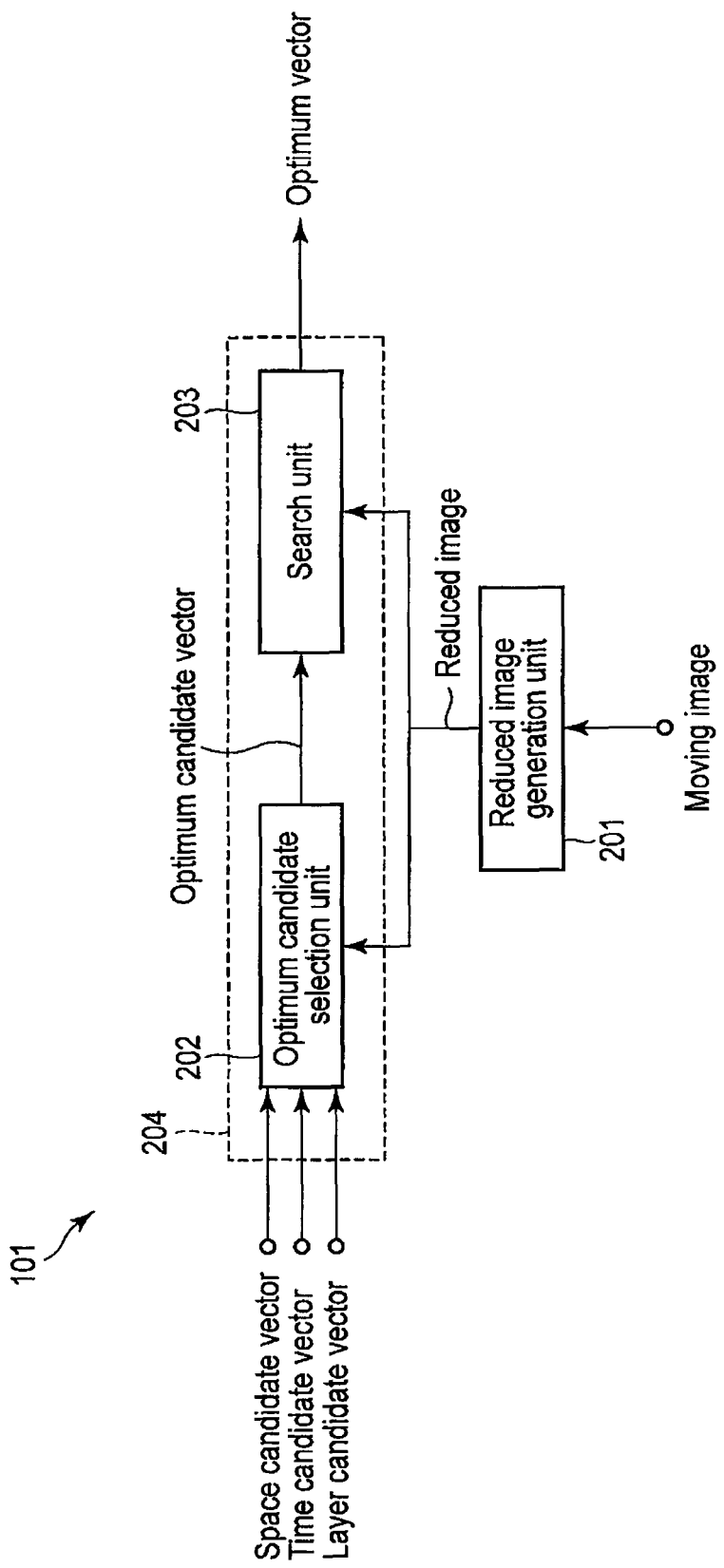
FIG. 2 is a block diagram showing an example of a configuration of an optimum vector determination unit.

In general, according to one embodiment, a motion vector detection apparatus includes a layering unit, a first extraction unit, a second extraction unit, a third extraction unit, and a determination unit. The layering unit is configured to generate layers with different resolutions for each of a first image and a second image, the first image and the second image being to be displayed at times different from each other, each of the resolutions indicating a number of first blocks which are set to a corresponding layer. The first extraction unit is configured to extract, as a space candidate vector, a motion vector assigned to a first reference block, the first reference block being located in a layer which corresponds to the first image and to which a target block belongs. The second extraction unit is configured to extract, as a time candidate vector, a motion vector assigned to a second reference block, the second reference block being located in a layer which corresponds to a third image and has a resolution identical to a resolution of the layer which corresponds to the first image and to which the target block belongs. The third image is being to be displayed at a time different from the times. The third extraction unit is configured to extract, as a layer candidate vector, a motion vector assigned to a third reference block, the third reference block being located in a layer which corresponds to the first image and has a lower resolution than the resolution of the layer which corresponds to the first image and to which the target block belongs. The determination unit is configured to determine a motion vector to be assigned to the target block, based on first correlations between the target block and second blocks, the second blocks being located in a layer which corresponds to the second image and being specified by assigning, to the target block, the space candidate vector, the time candidate vector, and the layer candidate vector. The first extraction unit, the second extraction unit, the third extraction unit, and the determination unit perform recursive processing.

The embodiment provides a motion vector detection apparatus and method enabling motion vectors to be accurately detected.

Hereinafter, motion vector detection apparatuses according to embodiments will be described with reference to the accompanying drawings. In the embodiments, like reference numbers denote like elements, and duplication of explanation will be avoided.

FIG. 1 schematically shows a configuration of a motion vector detection apparatus according to an embodiment. As shown in FIG. 1, the motion vector detection apparatus includes an optimum vector determination unit 101, a vector memory 102, a layer vector memory 103, a space candidate extraction unit 104, a time candidate extraction unit 105, and a layer candidate extraction unit 106.

The optimum vector determination unit 101 receives moving image data from an external apparatus (not shown). The optimum vector determination unit 101 then temporarily holds a plurality of frames (or still images) included in the moving image data. The optimum vector determination unit 101 also divides each of the held frames into blocks each of a predetermined size. The optimum vector determination unit 101 then determines motion vectors for the resultant blocks, one motion vector for each block. The block includes a plurality of pixels. In one example, the block is set to be 5 pixels×5 pixels in size.

In the embodiment, a block for which a motion vector is to be detected is referred to as a target block. The motion vector to be assigned to the target block is determined by the optimum vector determination unit 101 based on one or more space candidate vectors, one or more time candidate vectors, and one or more layer candidate vectors described below. The motion vector indicates a shift amount and the direction of the shift for each block between a frame serving as a reference and a frame to be displayed at a time different from that at which the first frame is displayed.

The optimum vector determination unit 101 further reduces the size of a frame to generate a plurality of reduced images, thus layering the frame. The optimum vector determination unit 101 then divides the reduced image for each layer into blocks each of a predetermined size, and determines motion vectors for the resultant blocks, one motion vector for each block. The motion vectors determined by the optimum vector determination unit 101 are transmitted to the vector memory 102.

The vector memory 102 stores motion vectors received from the optimum vector determination unit 101 in association with information indicative of the positions of the corresponding blocks. When motion vectors are determined for all the blocks in a certain layer, the motion vectors stored in the vector memory 102 are transmitted to the layer vector memory 103. The layer vector memory 103 stores the motion vectors received from the vector memory 102 in association with information indicative of the corresponding layer and the positions of and corresponding blocks.

The space candidate extraction unit (also referred to as the first extraction unit) 104 selects, as one or more reference blocks, one or more blocks which fall within a predetermined range corresponding to the position of the target block, from among the blocks in the layer to which the target block belongs. The space candidate extraction unit 104 then extracts, as space candidate vector, the motion vectors assigned to the selected reference blocks from the vector memory 102.

The time candidate extraction unit (also referred to as the second extraction unit) 105 selects, as one or more reference blocks, one or more blocks which fall within a predetermined range corresponding to the position of the target block, from among the blocks which are included in a certain frame and located in the same layer as that including the target block. The certain frame is a frame to be displayed at a time different from that at which the frame including the target block is displayed. The time candidate extraction unit 105 then extracts, as time candidate vectors, the motion vectors assigned to the selected reference blocks from the layer vector memory 103.

The layer candidate extraction unit (also referred to as the third extraction unit) 106 selects, as one or more reference blocks, one or more blocks which fall within a predetermined range corresponding to the position of the target block, from among the blocks included in a layer higher than that containing the target block. The layer candidate extraction unit 106 then extracts, as layer candidate vectors, the motion vectors assigned to the selected reference blocks from the layer vector memory 103.

The candidate vectors extracted by the space candidate extraction unit 104, time candidate extraction unit 105, and layer candidate extraction unit 106 are transmitted to the optimum vector determination unit 101. Processing subsequently carried out by the optimum vector determination unit 101 will be described below in detail.

FIG. 2 schematically shows the configuration of the optimum vector determination unit 101. As shown in FIG. 2, the optimum vector determination unit 101 includes a reduced image generation unit 201 which generates reduced images from a frame included in moving image data received from an external apparatus, an optimum candidate selection unit 202 which selects an optimum candidate vector from candidate vectors by block matching or the like, and a search unit 203 which searches for an optimum vector based on the selected optimum candidate vector. Furthermore, the optimum candidate selection unit 202 and the search unit 203 are collectively referred to as a motion vector determination unit 204.

The reduced image generation unit (also referred to as the layering unit) 201 shown in FIG. 2 reduces the size of a frame to generate a predetermined number of (for example, L−1) reduced images, thus layering the frame. The reduced image generation unit 201 reduces the size of the frame, an original image, in accordance with a resolution preset for the corresponding layer, to generate reduced images. The resolution described herein means the number of blocks into which a frame (or an image) is divided. For example, it is assumed that each of the frames included in moving image data is 500 pixels×500 pixels in size and that the block size and the number of layers L are 5 pixels×5 pixels and 3, respectively. Then, the resolution of the third layer is 100 blocks×100 blocks. Furthermore, in this example, when the size of the image in the third layer is halved in a vertical direction and a horizontal direction to generate an image for the second layer, the resolution of the second layer is 50 blocks×50 blocks. Similarly, the resolution of the first layer is 25 blocks×25 blocks.

Here, in the layered frame, a reduced image with the lowest resolution is referred to as the first layer. The reduced images are referred to as the second layer, the third layer, and so on in order of decreasing resolution. Furthermore, in the layered frame, an image with a lower resolution is defined to be a higher layer. An image with a higher layer is defined to be a lower layer. In this case, the first layer is highest.

Figure 3:
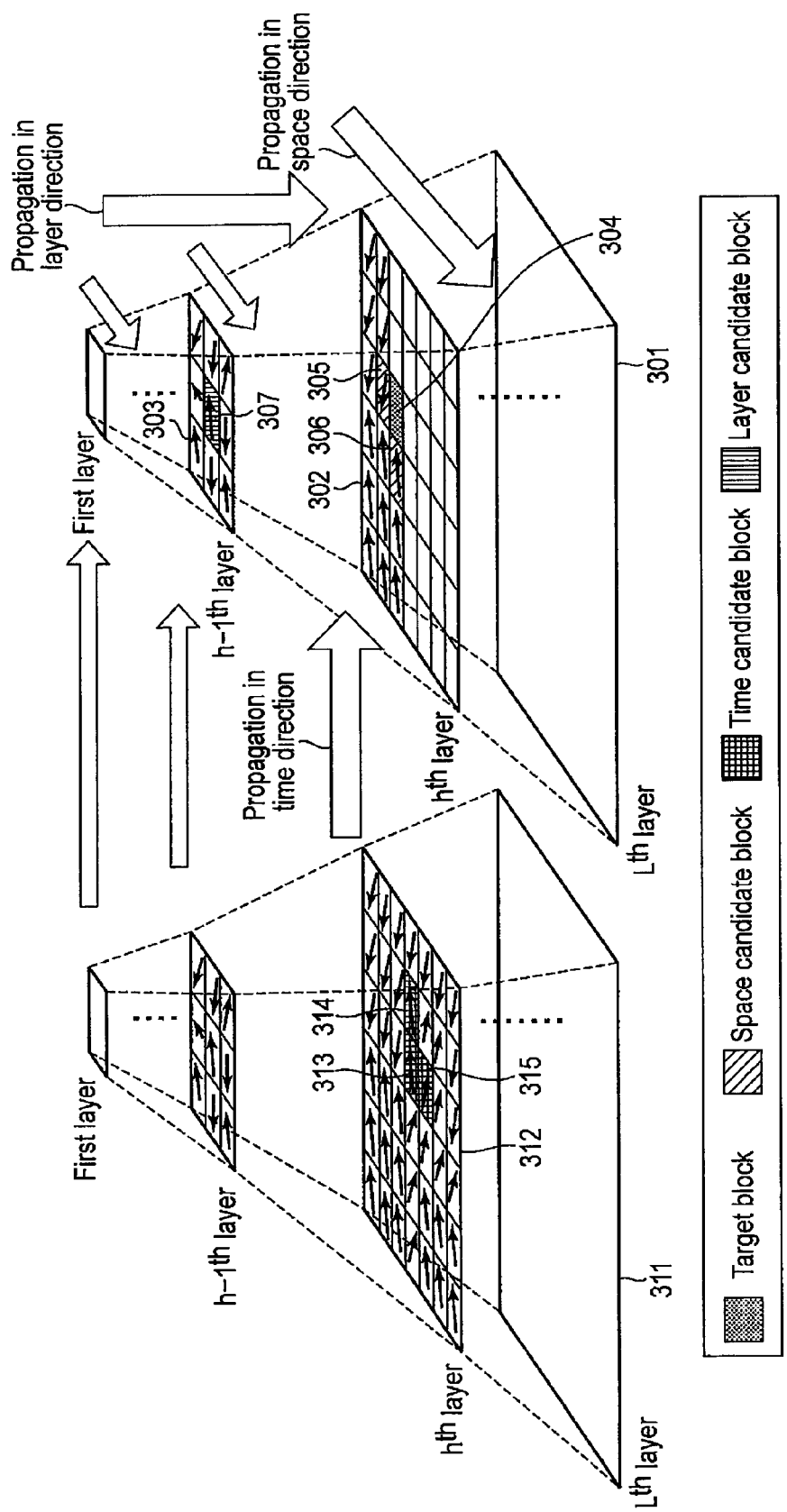
FIG. 3 is a schematic diagram showing storage areas in a vector memory and a layer vector memory.

FIG. 3 shows that motion vectors are assigned to a frame 301 displayed at a time t and a frame 311 displayed at time t−1 before time t. The frame 301 of time t indicates a frame for which motion vectors are to be detected, and is also referred to as a first frame or a target frame. Motion vectors assigned to the respective blocks corresponding to the first frame 301 indicate motion vectors directed toward a frame of time t+1 (also referred to as a second frame).

The frame of time t−1 is indicative of a frame for which time candidate vectors are to be extracted, and is also referred to as the third frame. Furthermore, motion vectors assigned to the blocks corresponding to the third frame 311 are indicative of motion vectors for the first frame 301. The first, second, and third frames may be frames displayed at different times. The second and third frames may be frames displayed at times before a time when the first frame is displayed or after a time when the target frame is displayed.

In the example shown in FIG. 3, in the first frame 301, the target block 304 is positioned in the $h^{th}$ layer. In the first frame 301, motion vectors have been determined for the blocks in the first to $h-1^{th}$ layers. The $h^{th}$ layer contains blocks for which motion vectors have already been determined and blocks for which motion vectors have not been determined yet. In the third frame 311, motion vectors have already been determined for the respective blocks in each of the layers. In the present embodiment, already determined space candidate vectors, time candidate vectors, and layer candidate vectors are recursively propagated to calculate the motion vector for each block.

Generated reduced images are temporarily held in the reduced image generation unit 201 shown in FIG. 2. In one example, the reduced image generation unit 201 generates images of different resolutions by carrying out a smoothing process based on a Gaussian filter or the like on the frame, and repeatedly reducing the size of the frame. The layered frame is transmitted to the optimum candidate selection unit 202 and the search unit 203.

The layering of the frame is not limited to the example in which the reduced image generation unit 201 as described above reduces the size of the original image. The layering may be implemented by dividing the original image according to a larger block size. For example, it is assumed that the original image is 500 pixels×500 pixels in size and that the number of layers is 3. Then, the block size may be set to 5 pixels×5 pixels for the third layer, 10 pixels×10 pixels for the second layer, and 20 pixels×20 pixels for the first layer without the need to change the size of the original image. This also allows generation of images of different resolutions for the respective layers.

Next, a method for selecting candidate vectors will be described with reference to FIG. 3 and FIG. 4.

Figure 4:
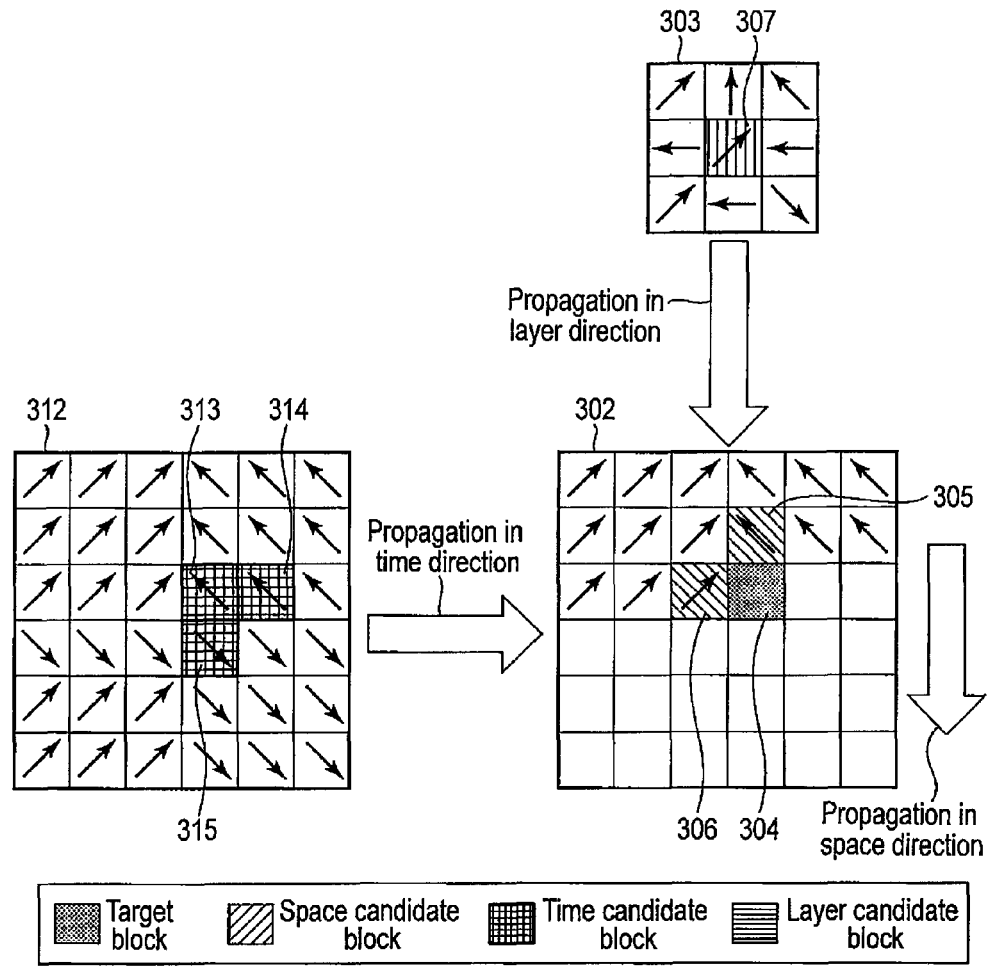
FIG. 4 is a schematic diagram selectively showing storage areas in the vector memory and the layer vector memory.

FIG. 4 shows the $h^{th}$ layer 302 and $h-1^{th}$ layer 303 of the first frame 301 and the $h^{th}$ layer 312 of the third frame 311, which are all shown in FIG. 3. The optimum candidate selection unit 202 in FIG. 2 determines vectors for each layer in order starting with the highest layer, that is, from the first layer toward the $L^{th}$ layer. As shown in FIG. 4, by way of example, in each layer, the motion vectors in the respective blocks are determined in order from the one located at an upper left position to the one located at a lower right position. More specifically, in the uppermost row, the motion vectors for the respective blocks are determined from left to right. Then, in the row immediately below the uppermost row, the motion vectors for the respective blocks are determined from left to right. In the embodiment, a direction corresponding to the direction of scan lines provided when the frame is displayed on a display apparatus is defined as the horizontal direction. A direction corresponding to the direction of signal lines provided when the frame is displayed on the display apparatus is defined as the vertical direction. Then, based on these directions, an up-down direction, a lateral direction, and rows and columns are defined.

In the $h^{th}$ layer 302 of the first frame 301, as shown in FIG. 4, for example, blocks 305 and 306 immediately to the left of and immediately above the target block 304 are selected as reference blocks (in FIG. 3 and FIG. 4, shown as space candidate blocks). The space candidate extraction unit 104 extracts motion vectors assigned to the reference bocks 305 and 306 as set $C_s$ of space candidate vectors as shown in:

$$C_S = \left\{ u_t^h\left(b + \begin{bmatrix} -1 \\ 0 \end{bmatrix}\right), u_t^h\left(b + \begin{bmatrix} 0 \\ -1 \end{bmatrix}\right) \right\},\quad \text{Expression 1}$$

where $u_t^h(x)$ denotes a motion vector for a block identified by a position vector x in the $h^{th}$ layer 302 of the first frame 301, and b denotes a position vector for the target block 304. The position of the target block 304 shown in FIG. 4 is shown as $b=(4, 3)^T$, where T denotes transposition. Symbols C, u, b, and x and symbols B and e shown below indicate the respective vectors and are shown in boldface in the expressions.

In this regard, the space candidate vector is not limited to the example shown by Expression 1 but may be extracted from any block located in the neighborhood of the target block 304 and for which a motion vector has already been determined. For example, the space candidate extraction unit 104 may extract, as set $C'_s$ of space candidate vectors, motion vectors assigned to blocks diagonally adjacent to the target block 304 in an upper left direction and an upper right direction.

$$C'_s = \left\{ u_t^h\left(b + \begin{bmatrix} -1 \\ -1 \end{bmatrix}\right), u_t^h\left(b + \begin{bmatrix} 1 \\ -1 \end{bmatrix}\right) \right\}\quad \text{Expression 2}$$

In another example, the union ($C_s \cup C'_s$) of the above-described sets $C_s$ and $C'_s$ may be set to be set of space candidate vectors. In yet another example, set $C_s$ may include a zero vector. Furthermore, for example, if the upper left vector for which a motion vector is determined firstly within the layer is the target block, the set of space candidate vectors may be an empty set or include a zero vector.

In the $h^{th}$ layer 312 of the third frame 311, a block 313 identified by the same position vector b as that for the target block 304 and blocks 314 and 315 immediately to the right of and immediately below block 313 are selected as reference blocks (in FIG. 3 and FIG. 4, shown as time candidate blocks). The time candidate extraction unit 105 extracts motion vectors assigned to the reference blocks 313, 314, and 315 as set $C_t$ of time candidate vectors as shown in:

$$C_t = \left\{ u_{t-1}^h\left(b + \begin{bmatrix} 1 \\ 0 \end{bmatrix}\right), u_{t-1}^h\left(b + \begin{bmatrix} 0 \\ 1 \end{bmatrix}\right), u_{t-1}^h(b) \right\}\quad \text{Expression 3}$$

In this regard, the time candidate vector is not limited to the example shown by Expression 3. The time candidate vector may be extracted from any block in the neighborhood of the position corresponding to the target block 304. For example, the time candidate extraction unit 105 may extract, as set $C'_t$ of time candidate vectors, a motion vector assigned to the reference block 313 in the $h^{th}$ layer 312 of the third frame 311, which corresponds to the target block, and blocks diagonally to the lower right and left of the reference block 313 as shown in:

$$C'_t = \left\{ u_{t-1}^h\left(b + \begin{bmatrix} 1 \\ 1 \end{bmatrix}\right), u_{t-1}^h\left(b + \begin{bmatrix} -1 \\ 1 \end{bmatrix}\right), u_{t-1}^h(b) \right\}\quad \text{Expression 4}$$

In another example, the union ($C_t \cup C'_t$) of the above-described sets $C_t$ and $C'_t$ may be set to be a set of time candidate vectors.

Moreover, in the $h-1^{th}$ layer 303 of the first frame 301, a block 307 corresponding to the target block 304 is selected as a reference block (in FIG. 3 and FIG. 4, shown as a layer candidate block). The layer candidate extraction unit 106 extracts, as set $C_h$ of layer candidate vectors, a motion vector assigned to the reference block 307 in the $h-1^{th}$ layer 303 immediately above the layer to which the target block 304 belongs, in accordance with:

$$C_h = \left\{ \frac{1}{k} u_t^{h-1}(\lceil kb \rceil) \right\},$$ Expression 5 where ⌈A⌉ indicates that an operation is performed on each component of a vector A to round a relevant value off to the closest whole number so as to leave an integer portion. Further, k denotes the size reduction rate of reduced images. The h−1$^{th}$ layer 303 is smaller than the h$^{th}$ layer 302 by the value of the size reduction rate k. Thus, extracted motion vectors are multiplied by a coefficient 1/k so as to be expanded in association with the h$^{th}$ layer 302.

The layer candidate vector is not limited to the example shown by Expression 5 but may be extracted from any block in the neighborhood of a position corresponding to the target block 304 in any higher layer. For example, the layer candidate extraction unit 106 may extract, as set C'$_h$ of layer candidate vectors, a motion vector assigned to block 307 included in the h−1$^{th}$ layer 313 of the first frame 301 and corresponding to the target block 304 and motion vectors assigned to blocks adjacent to block 307 in the up, down, right, and left directions, as shown in:

$$C'_h = \left\{ \begin{array}{c} \frac{1}{k} u_t^{h-1}(\lceil kb \rceil), \frac{1}{k} u_t^{h-1}\left(\lceil kb \rceil + \begin{bmatrix} 0 \\ -1 \end{bmatrix}\right), \\ \frac{1}{k} u_t^{h-1}\left(\lceil kb \rceil + \begin{bmatrix} -1 \\ 0 \end{bmatrix}\right), \\ \frac{1}{k} u_t^{h-1}\left(\lceil kb \rceil + \begin{bmatrix} 1 \\ 0 \end{bmatrix}\right), \frac{1}{k} u_t^{h-1}\left(\lceil kb \rceil + \begin{bmatrix} 1 \\ 0 \end{bmatrix}\right) \end{array} \right\}$$ Expression 6

Alternatively, the layer candidate extraction unit 106 may select layer candidate vectors from a plurality of higher layers. The layer candidate extraction unit 106 may extract, as set C"$_h$ of layer candidate vectors, motion vectors assigned to blocks included in the h−1$^{th}$ layer 313 and the h−2$^{th}$ layer and corresponding to the target block, for example, as shown:

$$C''_h = \left\{ \frac{1}{k} u_t^{h-1}(\lceil kb \rceil), \frac{1}{k^2} u_t^{h-2}(\lceil k^2 b \rceil) \right\}$$ Expression 7

As described above, the reference blocks are selected, for example, in accordance with Expression 1, Expression 3, and Expression 5, as shown in FIG. 5. The motion vectors assigned to the reference blocks are selected as candidate vectors. The extracted candidate vectors are transmitted to the optimum candidate selection unit 202.

Next, a method will be described by which the optimum candidate selection unit 202 shown in FIG. 2 selects the optimum candidate vector to be assigned to the target block, from the candidate vectors.

The optimum candidate selection unit 202 receives space candidate vectors from the space candidate extraction unit 104, time candidate vectors from the time candidate extraction unit 105, and layer candidate vectors from the layer candidate extraction unit 106.

The optimum candidate selection unit 202 calculates, based on block correlations, the correlations between the target block and the blocks which are correspond to the second frame and specified by the position vector of the target block and the extracted candidate vectors. The optimum candidate selection unit 202 then identifies a candidate vector with the greatest correlation value, and selects the identified candidate vector as the optimum candidate vector shown by:

$$\hat{u}_t^h$$ Expression 8

Specifically, the optimum candidate selection unit 202 selects, as the optimum candidate vector shown by Expression 8, one of a plurality of candidate vectors which has the minimum value of evaluation functions D (b, u), for example, as shown in:

$$\hat{u}_t^h = \underset{u \in C_1}{\arg\min}\, D(b, u),$$ Expression 9 where $C_1 = C_s \cup C_t \cup C_h$, and D (b, u) denotes an evaluation function for a motion vector u. The evaluation function D (b, u) is defined, for example, by:

$$D(b, u) = \frac{1}{|B(b)|} \sum_{x \in B(b)} |I_{dst}(x+u) - I_{src}(x)|,$$ Expression 10 where $I_{src}$ (x) denotes a pixel value of a pixel, which is specified by a position vector x, in a block corresponding to the first frame 301, $I_{dst}$ (x) denotes a pixel value of a pixel, which is specified by a position vector x, in a block corresponding to the third frame, and B (b) denotes a set of position vectors for pixels in a block specified by a position vector b. Furthermore, |A| means the absolute value of A when A is a scalar value or the number of elements in A when A is a set. The pixel values used to evaluate the correlation between the blocks may be luminance values or values for an RGB space which are indicative of color information on red, green, and blue.

In the above-described evaluation function, the absolute values of the differences between the pixel values are summed. However, the evaluation function is not limited to this. For example, the squares of differences between the pixel values may be summed. Moreover, in the above-described evaluation function, the sum of the absolute values of the differences among the pixel values is divided by the number of elements. However, the division may be omitted.

It is often assumed that, in an image, blocks with similar luminance distributions are present in the neighborhood of the target block. However, this assumption may not hold true at the boundary between objects. Thus, as shown below in Expression 11, the correlation between the target block and a reference block is added to the evaluation function as a penalty term (also referred to as a weight) α to allow a candidate vector similar to the target block to be easily selected. Thus, the addition of the weight α allows a reference block with a high correlation with the target block to be preferentially selected.

$$D(b, u) = \frac{1}{|B(b)|} \sum_{x \in B(b)} |I_{dst}(x+u) - I_{src}(x)| + \alpha(b, e)$$ Expression 11

Here, the weight α denotes the correlation between the target block and a reference block, and e denotes a position vector to the reference block as seen from the target block. For example, if a motion vector of block 306 immediately above the target block 304 is referenced as a candidate vector u, the weight α can be expressed as shown in:

$$\alpha\left(b,\begin{bmatrix}0\\-1\end{bmatrix}\right)=\frac{1}{|B(b)|}\sum_{x\in B(b)}\left|I_{src}\left(x+\begin{bmatrix}0\\-1\end{bmatrix}\right)-I_{src}(x)\right|\quad\text{Expression 12}$$

In this regard, the weight α is not limited to the example shown by Expression 12. The weight α may be calculated by squaring the absolute value or may be normalized as shown in:

$$\alpha\left(b,\begin{bmatrix}0\\-1\end{bmatrix}\right)=\frac{\sum_{x\in B(b)}\left(I_{src}\left(x+\begin{bmatrix}0\\-1\end{bmatrix}\right)-I_{src}(x)\right)}{\sqrt{\sum_{x\in B(b)}I_{src}^2\left(x+\begin{bmatrix}0\\-1\end{bmatrix}\right)}\sqrt{\sum_{x\in B(b)}I_{src}^2(x)}}\quad\text{Expression 13}$$

As shown in FIG. 6, the search unit 203 searches within a local area based on the optimum candidate vector shown by Expression 8 to determine the optimum vector shown by:

$$\tilde{u}_t \quad\text{Expression 14}$$

Specifically, as shown below in Expression 15, the search unit 203 determines, as the optimum vector, one of the optimum candidate vector and a plurality of local vectors which minimizes the evaluation function shown in Expression 14; the local vectors are generated by varying the optimum candidate vector in an infinitesimal manner.

$$\tilde{u}_t = \underset{u\in C_2}{\arg\min}\, D(b, u) \quad\text{Expression 15}$$

Here, set $C_2$ of local vectors includes the optimum candidate vector shown below by Expression 17 and local vectors obtained by varying the optimum candidate vector in the up, down, right, and left directions in an infinitesimal manner, for example, as shown in:

$$C_2 = \left\{\hat{u}+\begin{bmatrix}0\\-\varepsilon\end{bmatrix}, \hat{u}+\begin{bmatrix}-\varepsilon\\0\end{bmatrix}, \hat{u}, \hat{u}+\begin{bmatrix}\varepsilon\\0\end{bmatrix}, \hat{u}+\begin{bmatrix}0\\\varepsilon\end{bmatrix}\right\}\quad\text{Expression 16}$$

$$\hat{u} \quad\text{Expression 17}$$

Here, ε denotes an infinitesimal constant. For example, ε indicates the distance between pixels.

In this regard, set $C_2$ of local vectors is not limited to the example shown by Expression 16 but a broader search range may be set as shown in:

$$C_2 = \left\{\begin{array}{l}\hat{u}+\begin{bmatrix}0\\-2\varepsilon\end{bmatrix}, \hat{u}+\begin{bmatrix}-\varepsilon\\-\varepsilon\end{bmatrix}, \hat{u}+\begin{bmatrix}0\\-\varepsilon\end{bmatrix},\\ \hat{u}+\begin{bmatrix}\varepsilon\\\varepsilon\end{bmatrix}, \hat{u}+\begin{bmatrix}-2\varepsilon\\0\end{bmatrix}, \hat{u}+\begin{bmatrix}-\varepsilon\\0\end{bmatrix},\\ \hat{u}, \hat{u}+\begin{bmatrix}\varepsilon\\0\end{bmatrix}, \hat{u}+\begin{bmatrix}2\varepsilon\\0\end{bmatrix}, \hat{u}+\begin{bmatrix}-\varepsilon\\\varepsilon\end{bmatrix},\\ \hat{u}+\begin{bmatrix}0\\\varepsilon\end{bmatrix}, \hat{u}+\begin{bmatrix}\varepsilon\\\varepsilon\end{bmatrix}, \hat{u}+\begin{bmatrix}0\\2\varepsilon\end{bmatrix}\end{array}\right\}\quad\text{Expression 18}$$

Furthermore, the local search may be performed on all the candidate vectors to determine the optimum vector as shown below in Expression 19 and Expression 20 instead of being carried out after the optimum candidate vector has been selected. In this case, the optimum vector is determined without the need to select the optimum candidate vector.

$$C' = \left\{\begin{array}{l}u+\begin{bmatrix}0\\-\varepsilon\end{bmatrix}, u+\begin{bmatrix}-\varepsilon\\0\end{bmatrix}, u, u+\begin{bmatrix}\varepsilon\\0\end{bmatrix}, u+\begin{bmatrix}0\\\varepsilon\end{bmatrix}\\ \forall u\in C_1\end{array}\right\}\quad\text{Expression 19}$$

$$\tilde{u}_t = \underset{u\in C'}{\arg\min}\, D(b, u) \quad\text{Expression 20}$$

As described above, the optimum vector determination unit 101 determines a motion vector for the target block based on candidate vectors including space candidate vectors, time candidate vectors, and layer candidate vectors.

Figure 7:
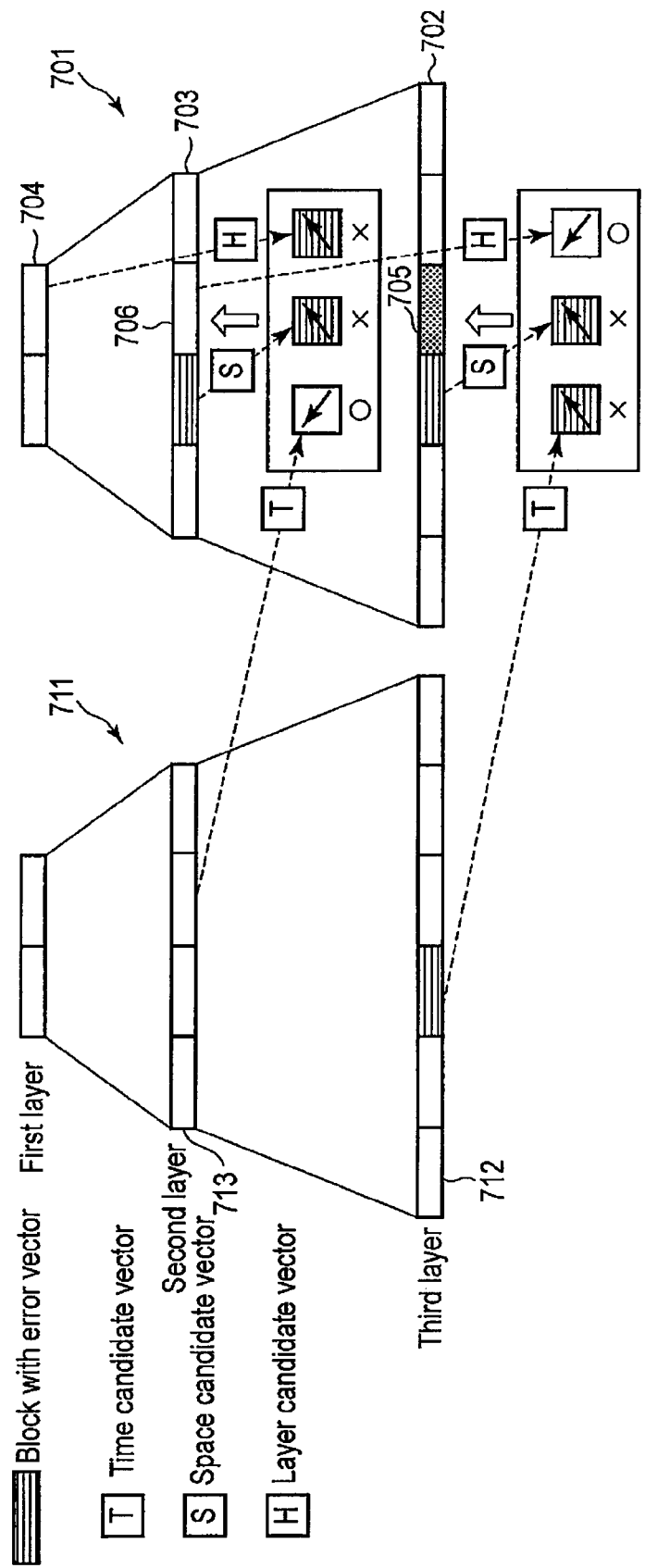
FIG. 7 is a diagram showing an example in which misdetected motion vectors is corrected by recursive processing.

In the motion vector detection apparatus according to the present embodiment, for calculation of a motion vector for each of the blocks in each layer, one of the space candidate vectors, time candidate vectors, and layer candidate vectors is selected as the optimum candidate vector. This allows motion vectors to be accurately determined. By way of example, as shown in FIG. 7, when a motion vector is calculated for a block 706 positioned in the second layer 703 of a first frame 701, even if space candidate vectors extracted from the second layer 703 and layer candidate vectors extracted from the first layer 704 are erroneously calculated, the motion vector for block 706 can be accurately calculated by selecting from time candidate vectors extracted from the second layer 713 of the third frame 711. A motion vector for a block 705 in the third layer 702 can also be accurately calculated by referencing the motion vector for block 706 in the second layer 703 as a layer candidate vector even if space candidate vectors extracted from the third layer 702 of the first frame 701 and layer candidate vectors extracted from the third layer 712 of the third frame 711 are erroneous.

As described above, the motion vector detection apparatus according to the present embodiment carries out the recursive processing in which a calculated motion vector is used for a calculation for the next block. Thus, errors in motion vectors can be progressively reduced. Moreover, motion vectors with reduced errors can be estimated by sequentially carrying out the recursive processing in terms of the space, time, and layers.

Next, the structures of the vector memory 102 and layer vector memory 103 will be specifically described with reference to FIGS. 8A to 8F.

The vector memory 102 temporarily stores motion vectors for blocks in the layer including the target block. Thus, the vector memory 102 may be provided with a capacity sufficient to store as many motion vectors as the blocks included in the lowest layer. If the third layer which is the lowest layer has a resolution of 100 blocks×100 blocks as in the above-described example, the vector memory 102 may be provided with a capacity sufficient to store 10,000 motion vectors. In the vector memory 102, motion vectors are stored in association with information indicative of the positions of the blocks.

The layer vector memory 103 stores determined motion vectors according to layer; areas in the layer vector memory 103 are assigned to the motion vectors so as to allow the motion vectors to be stored according to layer. If the third layer which is the lowest layer has a resolution of 100 blocks× 100 blocks, the second layer has a resolution of 50 blocks×50 blocks, and the first layer has a resolution of 25 blocks×25 blocks as in the above-described example, the layer vector memory 103 may be provided with a capacity sufficient to store a total of 13,125 motion vectors. In the layer vector memory 103, motion vectors are stored in association with information indicative of the positions of the blocks.

FIGS. 8A to 8F show an example of operations of the vector memory 102 and the layer vector memory 103. In this case, for simplification, the number of layers L is 3, the first layer is divided into 3 blocks×3 blocks, the second layer is divided into 4 blocks×4 blocks, and the third layer is divided into 6 blocks×6 blocks.

As shown in FIG. 8A, while a motion vector is being calculated for the target block in the first layer of the frame of time t, motion vectors calculated for blocks in the first to third layers of the frame of time t−1 are stored in the layer vector memory 103. The optimum candidate selection unit 202 references space candidate vectors, time candidate vectors, and layer candidate vectors to calculate motion vectors for the blocks in the first layer. When the motion vector for the target block in the first layer is calculated, since no layer is present above the first layer, a virtual layer is assumed to be present. Then, layer candidate vectors are assumed to be zero vectors. Time candidate vectors are extracted from the area for the first layer reserved in the layer vector memory 103.

As shown in FIG. 8B, when motion vectors are determined for all the blocks in the first layer, information stored in the vector memory 102 is copied to the area for the first layer in the layer vector memory 103. Thus, in the layer vector memory 103, motion vectors associated with the frame of time t are stored in the area for the first layer. Motion vectors associated with the frame of time t−1 are stored in the areas for the second and third layers. The information in the vector memory 102 may be deleted after the copying ends or overwritten with information on the next, second layer.

As shown in FIG. 8C, when motion vectors are calculated for blocks in the second layer, layer candidate vectors are extracted from the area for the first layer reserved in the layer vector memory 103, time candidate vectors are extracted from the area for the second layer reserved in the layer vector memory 103, and space candidate vectors are extracted from the vector memory 102. As shown in FIG. 8D, when motion vectors are determined for all the blocks in the second layer, the information stored in the vector memory 102 is copied to the area for the second layer in the layer vector memory 103.

Subsequently, as shown in FIG. 8E, when motion vectors are calculated for blocks in the third layer, layer candidate vectors are extracted from the area for the second layer reserved in the layer vector memory 103, time candidate vectors are extracted from the area for the third layer reserved in the layer vector memory 103, and space candidate vectors are extracted from the vector memory 102. As shown in FIG. 8F, when motion vectors are determined for all the blocks in the third layer, information stored in the vector memory 102 is copied to the area for the third layer in the layer vector memory 103.

When motion vectors are calculated for all the layers of the frame of time t, the information stored in the vector memory 102, that is, the information including the motion vectors for the blocks in the frame of time t is output to the external equipment. Processing of the next frame of time t+1 is then started. When the processing of the frame of time t+1 is started, the information stored in the layer vector memory 103 relates to the frame of time t.

In the above description, the layer vector memory 103 is overwritten, as required, with the information stored in the vector memory 102. However, the layer vector memory 103 is not limited to this configuration. The capacity of the layer vector memory 103 may be increased to allow the layer vector memory 103 to store motion vector information on a plurality of frames of the respective times. When motion vector information on a plurality of frames of the respective times is stored in the layer vector memory 103, motion vectors associated with a plurality of frames of times different from that of the target frame can be extracted as time candidate vectors.

Next, a procedure for determining a motion vector for each of the blocks in the target frame will be described with reference to FIG. 9.

First, in step S901, a target block is selected in accordance with a predetermined order. In step S902, the space candidate extraction unit 104 selects one or more space candidate vectors from one or more particular reference blocks, for example, as shown in Expression 1 or Expression 2. In step S903, the time candidate extraction unit 105 selects one or more time candidate vectors from one or more particular reference blocks, for example, as shown in Expression 3 or Expression 4. In step S904, the layer candidate extraction unit 106 selects one or more layer candidate vectors from one or more particular reference blocks, for example, as shown in Expression 5, Expression 6 or Expression 7. Steps S902 to S904 may be carried out in a different order as required. In steps S902 to S904, candidate vectors including space candidate vectors, time candidate vectors, and layer candidate vectors are selected.

In step S905, the optimum vector for the target block is determined based on the candidate vectors selected in steps S902 to S904. Step S905 will be described with reference to FIG. 10. In step S906, the selected optimum vector is stored in the vector memory 102.

In step S907, the process determines whether or not motion vectors have been determined for all the blocks in the layer being processed. If any block has failed to have a motion vector determined, the process returns to step S901 to select the next target block. Since steps S901 to S906 are repeated to determine motion vectors for all the blocks in the layer being processed, the process proceeds to step S908.

In step S908, the information stored in the vector memory 102 is copied to the layer vector memory 103. In step S909, the process determines whether or not all the layers of the target frame have been processed. That is, the process determines whether or not lowest layer (for example, the $L^{th}$ layer) of the target frame has been processed. If any layer has failed to be processed, the process returns to step S901. If all the layers of the target frame have been processed, then in step S910, the information stored in the vector memory 102 is output to, for example, an image processing apparatus (not shown). Then, the series of processes end.

Next, a procedure for determining the optimum block for the target block will be described with reference to FIG. 10.

First, in step S1001, the reduced image generation unit 201 generates a reduced image corresponding to the layer to be processed. The generation of a reduced image shown in step S1001 may be pre-executed upon reception of the frame. In step S1002, for example, as shown in Expression 9, the optimum candidate selection unit 202 identifies a reference block with the highest correlation with the target block. The optimum candidate selection unit 202 then selects a candidate vector for the identified reference block as the optimum candidate vector. In step S1003, the search unit 203 determines the optimum vector based on the selected optimum candidate vector, for example, as shown in Expression 15 and Expression 16.

As described above, the motion vector detection apparatus according to the present embodiment uses determined motion vectors to recursively calculate a motion vector for the target block. This enables an increase in the accuracy with which motion vectors are detected.

The motion vector detection apparatus according to the present embodiment is applicable in various fields. For example, for a frame interpolation technique to achieve a high frame rate to improve the image quality of a television, the motion vector detection apparatus according to the present embodiment is utilized to generate a frame to be interpolated between frames included in a moving image. Furthermore, the increased detection accuracy of the motion vector detection apparatus according to the present embodiment allows the efficiency of encoding of moving images and the image stabilization performance of a camera to be improved. Moreover, the motion vector detection apparatus according to the present embodiment can be utilized to estimate three-dimensional depth information from two-dimensional image information.

The motion vector detection apparatus according to the present embodiment can be utilized for various image processing techniques, for example, a frame interpolation technique.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A motion vector detection apparatus comprising:
a layering unit configured to generate at least three layers with different resolutions for each of a first image and a second image, the first image and the second image being to be displayed at times different from each other, each of the resolutions indicating a number of first blocks which are set to a corresponding layer;
a first extraction unit configured to extract, as a space candidate vector, a motion vector assigned to a first reference block, the first reference block being located in a layer which corresponds to the first image and to which a target block belongs;
a second extraction unit configured to extract, as a time candidate vector, a motion vector assigned to a second reference block, the second reference block being located in a layer which corresponds to a third image and has a resolution identical to a resolution of the layer which corresponds to the first image and to which the target block belongs, the third image being to be displayed at a time different from the times;
a third extraction unit configured to extract, as a layer candidate vector, a motion vector assigned to a third reference block, the third reference block being located in a layer which corresponds to the first image and has a lower resolution than the resolution of the layer which corresponds to the first image and to which the target block belongs, wherein the third extraction unit uses, as the layer candidate vector, a zero vector when the resolution of the layer which corresponds to the first image and to which a target block belongs is identical to a lowest resolution; and a determination unit configured to
select, as an optimum candidate vector, one of the space candidate vector, the time candidate vector, and the layer candidate vector, the optimum candidate vector having a highest first correlation of first correlations between the target block and second blocks, the second blocks being located in a layer which corresponds to the second image and being specified by assigning, to the target block, the space candidate vector, the time candidate vector, and the layer candidate vector,
generate local vectors by varying the optimum candidate vector,
select one of the local vectors as an optimum vector, the optimum vector having a highest second correlation of second correlations between target block and third blocks, the third blocks corresponding to the second image and being specified by the local vectors, and
determine the optimum vector as a motion vector for the target block,
wherein the extracting the motion vector assigned to the first reference block, the extracting the motion vector assigned to the second reference block, the extracting the motion vector assigned to the third reference block, and the determining are performed for each of the layers with the different resolutions.

2. The apparatus according to claim 1, wherein the layering unit generates the layers by reducing a size of each of the first image and the second image or changing a size of blocks into which each of the first image and the second image is divided.

3. The apparatus according to claim 1, wherein the third extraction unit selects third reference blocks from a plurality of layers higher than the layer to which the target block belongs.

4. The apparatus according to claim 1, wherein the determination unit calculates the first correlations using, as weights, a correlation between the target block and the first reference block, a correlation between the target block and the second reference block, and a correlation between the target block and the third reference block.

5. The apparatus according to claim 1, wherein the determination unit generates local vectors by varying the space candidate vector, the time candidate vector, and the layer candidate vector, and calculates third correlations between the target block and fourth blocks, the fourth blocks being specified by assigning the space candidate vector, the time candidate vector, the layer candidate vector, and the local vectors to the target block.

6. The apparatus according to claim 1, wherein the determination unit determines motion vectors be assigned to target blocks for respective layers corresponding to the first image.

7. A motion vector detection method comprising:
generating at least three layers with different resolutions for each of a first image and a second image, the first image and the second image being to be displayed at times different from each other, each of the resolutions indicating a number of first blocks which are set to a corresponding layer;
extracting, as a space candidate vector, a motion vector assigned to a first reference block, the first reference block being located in a layer which corresponds to the first image and to which a target block belongs;
extracting, as a time candidate vector, a motion vector assigned to a second reference block, the second reference block being located in a layer which corresponds to a third image and has a resolution identical to a resolution of the layer which corresponds to the first image and to which the target block belongs, the third image being to be displayed at a time different from the times;

extracting, as a layer candidate vector, a motion vector assigned to a third reference block, the third reference block being located in a layer which corresponds to the first image and has a lower resolution than the resolution of the layer which corresponds to the first image and to which the target block belongs, wherein the extracting the motion vector assigned to the third reference block comprises using, as the layer candidate vector, a zero vector when the resolution of the layer which corresponds to the first image and to which a target block belongs is identical to a lowest resolution;

selecting, as an optimum candidate vector, one of the space candidate vector, the time candidate vector, and the layer candidate vector, the optimum candidate vector having a highest first correlation of first correlations between the target block and second blocks, the second blocks being located in a layer which corresponds to the second image and being specified by assigning, to the target block, the space candidate vector, the time candidate vector, and the layer candidate vector;

generating local vectors by varying the optimum candidate vector;

selecting one of the local vectors as an optimum vector, the optimum vector having a highest second correlation of second correlations between target block and third blocks, the third blocks corresponding to the second image and being specified by the local vectors; and determining the optimum vector as a motion vector for the target block, wherein the extracting the motion vector assigned to the first reference block, the extracting the motion vector assigned to the second reference block, the extracting the motion vector assigned to the third reference block, and the determining are performed for each of the layers with the different resolutions.

8. The method according to claim 7, wherein the generating comprises generating the layers by reducing a size of each of the first image and the second image or changing a size of blocks into which each of the first image and the second image is divided.

9. The method according to claim 7, wherein the extracting the motion vector assigned to the third reference block comprises selecting third reference blocks from a plurality of layers higher than the layer to which the target block belongs.

10. The method according to claim 7, wherein the determining comprises calculating the first correlations using, as weights, a correlation between the target block and the first reference block, a correlation between the target block and the second reference block, and a correlation between the target block and the third reference block.

11. The method according to claim 7, wherein the determining comprises generating local vectors by varying the space candidate vector, the time candidate vector, and the layer candidate vector, and calculating third correlations between the target block and fourth blocks, the fourth blocks being specified by assigning the space candidate vector, the time candidate vector, the layer candidate vector, and the local vectors to the target block.

12. The method according to claim 7, wherein the determining comprises determining motion vectors be assigned to target blocks for respective layers corresponding to the first image.

* * * * *